United States Patent [19]

Lerude et al.

[11] Patent Number: 4,620,265
[45] Date of Patent: Oct. 28, 1986

[54] MODULAR CELL FOR SUPPORTING AND PROTECTING ELECTRONIC CARDS

[75] Inventors: Gérard Lerude, Antibes; Christine Roux, Le Rouret, both of France

[73] Assignee: La Telemecanique Electrique, France

[21] Appl. No.: 699,097

[22] Filed: Feb. 7, 1985

[30] Foreign Application Priority Data

Feb. 9, 1984 [FR] France ............................... 84 01915

[51] Int. Cl.⁴ .............................................. H05K 5/02
[52] U.S. Cl. .................................. 361/424; 174/52 R; 211/41; 339/76; 339/141; 361/415; 361/420
[58] Field of Search ............................. 361/390–391, 361/394–395, 399, 413, 415, 420, 424, 427; 174/52 R; 339/76–78, 141; 211/41, 44

[56] References Cited

U.S. PATENT DOCUMENTS 3,271,626  9/1966  Howrilka ........................... 361/415

Primary Examiner—Arthur T. Grimley
Assistant Examiner—Jane K. Lau
Attorney, Agent, or Firm—William A. Drucker

[57] ABSTRACT

A modular cell for supporting and protecting electronic cards formed by a flat element or blank having two parallel lateral edge portions, a front edge portion and a rear edge portion and, extending perpendicularly to said blank, from its rear edge portion and from its two lateral edge portions, respectively a bottom and two lateral sides having card guide means forming two respective lateral slides parallel to the blank. This cell being further provided with fixing means for holding the card in position with respect to said blank, once the card has reached its position of use inside the cell, after sliding in said slides.

15 Claims, 11 Drawing Figures

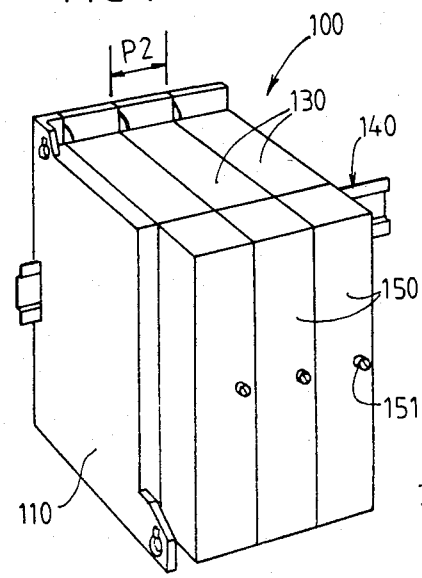
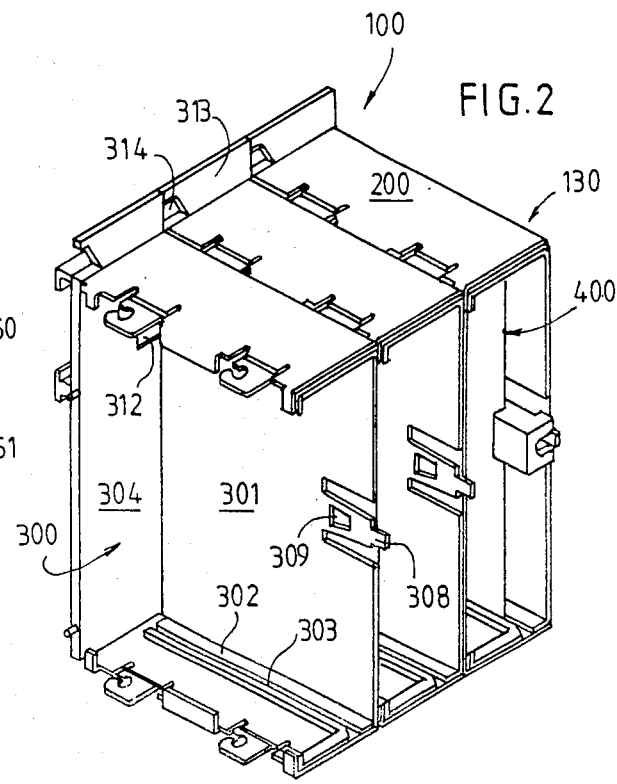
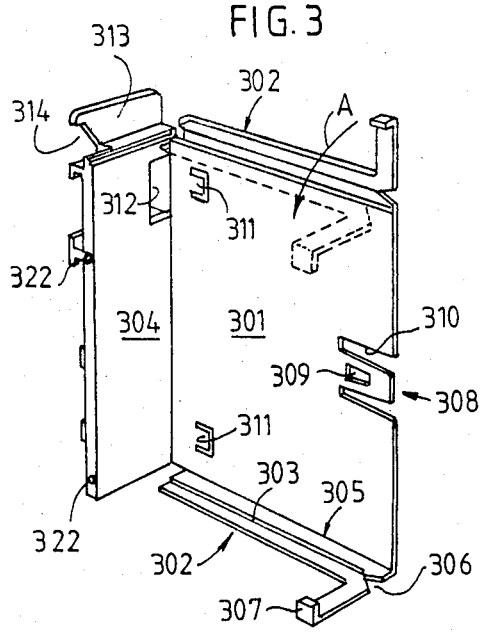
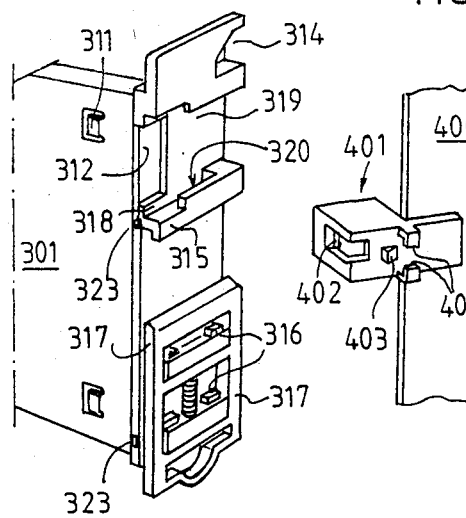

MODULAR CELL FOR SUPPORTING AND PROTECTING ELECTRONIC CARDS

BACKGROUND OF THE INVENTION

1. Field of the Invention

The present invention relates to a modular cell for supporting and protecting electronic cards usable more especially, but not exclusively, in forming cell-like card holding structures.

2. Description of the Prior Art

Generally the construction of multicard electronic devices are juxtaposing and possibly assembling modular cells each containing an electronic card is known. These cells may be constructed from boxes formed in one or more parts, inside which the cards are disposed, or even of support structures each comprising two opposite walls on which are provided two respective slides in which the card is slidingly engaged and is then fixed in position by means of fixing devices provided on said walls. Of course, these cells are adapted so as to allow connector terminal strips to be fixed to the front and/or possibly rear edge portions of the cards and to allow the corresponding connections to pass. They must moreover be accurately designed so as to guarantee good interconnection and assembly conditions which, consequently, considerably increases their cost of manufacture and increases the assembly time.

The aim of the invention is therefore to overcome these disadvantages. It provides a modular cell of simple design, easily constructable by mass production methods from an inexpensive material, and consequently of a low cost price.

SUMMARY OF THE INVENTION

This modular cell comprises more particularly, on the one hand, a flat element or blank having two parallel lateral edge portions, a front edge portion and a rear edge portion and, on the other hand, extending perpendicularly to said blank from its rear edge portion and from its two side edge portions, a bottom and two lateral sides, this assembly defining a substantially parallelepipedic volume open on the face opposite said blank and on its front side (opposite said bottom). The two lateral sides of the cell comprise means for guiding the cards forming two respective lateral slides, parallel to the blank and at a small distance therefrom. The spacing of these two slides is provided so that the cards may be engaged by two of their opposite side edge portions and may be slid therein.

According to the invention, the cell further comprises fixing means for holding the card in position with respect to said blank once the card has reached its position of use inside the cell, after sliding in the guide means. These fixing means may advantageously comprise snap fit means provided on the blank cooperating with corresponding snap fit means provided on or fixed to the card, these snap fit means providing self centering then fixing of the card to said blank.

The blank used in the previously described cell has therefore multiple functions:
- it serves for protecting the face of the card where welding is carried out
- it serves as a support for the bottom and lateral sides of the cell on which the slides are provided,
- it serves for accurately positioning the card inside the cell, in combination with said fixing means.

This latter function is particularly important since, by itself, it allows self alignment of the card and its front and rear connectors and consequently considerably reduces the precision requirements particularly in so far as the lateral sides supporting the slides are concerned and eliminates play at the end of assembly.

With this reduction of precision requirements, it allows a cell to be constructed in which the lateral sides are connected to the lateral edge portions of the blank by means of hinge connections.

This structure is particularly advantageous in the case where the cell is made from a molded plastic material. In this case, the blank and the two lateral sides of the cell are molded flat, only the bottom extending perpendicularly to the blank. The mold used is therefore considerably simplified. Once the molding is finished, the two lateral sides are bent back at 90° about hinge connections so as to give the cell its final shape. The lateral sides may then be held perpendicularly to the blank by means of a snap fit device provided between the bottom and the lateral side portion of the lateral sides adjacent said bottom and possibly by means of abutment surfaces provided between said lateral sides and said blank.

The hinge connections between the lateral sides and the blank do not require a high precision for the reasons mentioned above. They may therefore be simply formed as integrally molded flexible connecting lugs or as lines of smaller thickness.

Of course, the bottom of the cell may comprise at least one passage window for a rear connector plugable into the rear connections of the card. So as to allow preadjustment of the rear connectors, these passage windows may have a width greater than that of the connectors. The rear face of the bottom may further have at right angles to the window, bearing surfaces for corresponding faces of the connector, whereas means are provided at the rear of the cell for securing the connector, for example of the snap fit or interlock resilient blade type. With this arrangement, the first plug-in position of the connector on the card previously fixed in the cell may more especially be memorized.

The above described cell may further comprise a shield formed by a piece of sheet metal having a flat face substantially to the dimensions of said blank and intended to cover this latter and two side wings folded back substantially at right angles and intended to come back against said lateral sides.

This shield intended to provide electrical protection of the card housed in the cell further ensures the rigidity and mechanical protection of the cell. It comprises fixing means for example snap fit means, for fixing the cell as well as male and female assembly means for rigidly fitting adjacent cells together so as to form card holding cell-like structures.

BRIEF DESCRIPTION OF THE DRAWINGS

The advantages and features of the invention will be more clearly understood from the following description of one embodiment of the invention given by way of non limitative example, with reference to the accompanying drawings in which:

FIG. 1 shows in perspective one embodiment of a cell-like structure having three modular cells called hereafter pockets, formed from card guide cells in accordance with the invention.

FIG. 2 shows a part of the same structure seen in perspective.

FIG. 3 shows, in perspective, a card guide cell used in the structure shown in FIG. 1.

FIG. 4 shows the rear face of the bottom of the same cell.

FIG. 5 shows a detail of the edge of a card used in a cell according to the invention.

DESCRIPTION OF THE PREFERRED EMBODIMENT

Figure 6:
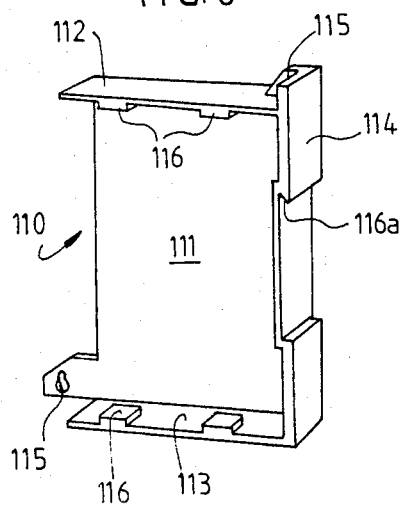
FIG. 6 is a rear perspective view of a head base.

The cell-like electronic card-holding structure 100 shown in the Figures comprises a head base 110 and several pockets 130 each provided with an insulating card guide cell 300, each cell being covered with a metal shield 200 and being adapted to receive an electronic card 400.

The pockets are assembled together so as to form a rigid multicard assembly, for example a programmable controller, this assembly being fixed laterally or by its rear part to a support, for example to a standardized section 140 or to a plate. Each pocket receives a terminal strip 150 on its front face.

The card guide cell 300 is molded in a single piece so as to have the form shown in FIG. 2; it is held in position by interlocking fitment and is protected in the metal shield 200 (FIG. 7) and forms, at the same time as a housing for card 400 a means for fixing the card and its front terminal strip 150 and a means for mutually positioning the card and its rear connector 600.

The card guide cell 300 comprises (FIGS. 2 to 4) a flat element or blank 301 protecting the welding face of the electronic card, two lateral sides or L shaped flaps 302, having slides 303 for the card, as well as a bottom 304 intended to form a rear fixing base. The flaps 302 are connected to the blank 301 by hinge lines 305, whereas the slides 303 open forwardly through V shaped openings 306; the small leg of the L of each flap has a step 307.

Flaps 302 are bent as shown by the arrow A in FIG. 3 so as to occupy the position shown with broken lines for the upper flap and with continuous lines for the lower flap. A snap fit or other fixing means is provided for fixing flaps 302 to the bottom 304.

The blank 301 further comprises a resilient tongue 308 having a recess 309, the tongue and the recess having a V shape converging towards the front, the tongue being situated in a frontal clearance 310 provided in the edge of the blank.

In the rear part of the blank are formed resilient catches 311 whose purpose will be explained further on.

The bottom or base 304 of the card guide cell 300 has a window 312 allowing free passage for the connector 600 associated with the cell, this window having a width and a height greater than those of the connector so as to allow lateral movement of this latter. Bottom 304 further comprises an upper tab 313 with lateral fixing notch 314, and at the rear (FIG. 4) a grooved projection 315 for fixing to a standardized rail and guides 316 for receiving a sliding catch 317 for locking the card guide cell on the rail. The card guide cell may thus be fixed directly either to a rail, or to any support by means of a screw engaged in recess 314 closed by the tab of an adjacent pocket or by the base (FIG. 2).

On the rear face of bottom 304, the card guide cell has at right angles to window 312 bearing faces 318 for cooperating faces of the connector 600 and an indented housing 319 defining notches 320 for receiving the means for securing the connector which will be described further on.

Complementary centering elements, namely pins 322 and holes 323 are provided respectively on each side of bottom 304 on the lateral faces thereof for assembly between pockets or between pocket and base.

Figure 7:
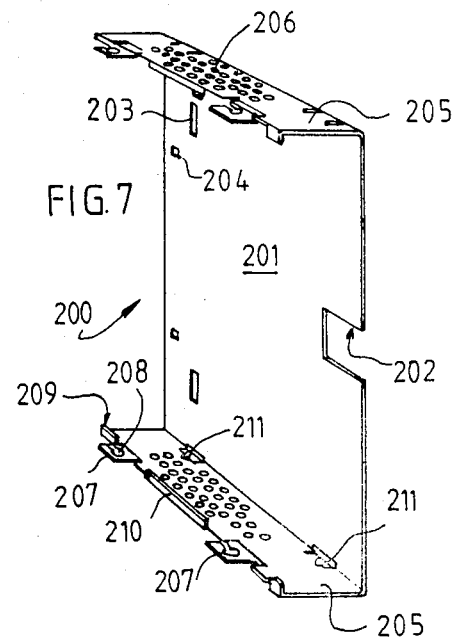
FIG. 7 shows, in a front perspective view, the shield of a cell.

The metal shield 200 shown in FIGS. 2 and 7 has a U shaped section whose web 201 has an opening 202 corresponding substantially to the clearance 310 provided in the lateral dividing wall 301 of the associated card guide cell, as well as openings 203 and 204. The openings 203 form an engagement means for catches 311 of the card guide cell, whereas openings 204 receive, if such are provided, the catches of the base. The wings 205 of the U shaped shield have evenly spaced perforations 206, lugs 207 with hook forming slots 208 and stiffening pins 209, 210 forming a stop more especially for the step 307 of the L shaped flap of the card guide cell.

Slots 211 are formed by cutting at the bends of the U shape whereas lugs 207 are situated in planes offset inwardly with respect to the planes of the wings 205 of the shield; thus two adjacent pockets are assembled together by introducing lugs 207 of the shield of one into the slots 211 of the lugs of the shield of the other then perpendicularly sliding the shields relative to each other so as to engage the slots 208 of one on the web 201 of the other.

On the front edge of each card 400 is disposed a fixing block 401 (FIG. 5) having towards the front an anchor nut or tapped orifice 402 for fixing a screw 151 provided on the associated terminal strip 150, and having laterally a catch or other locking element 403 adapted for cooperating with the recess 309 of the resilient tongue 308 of the card guide cell.

Two guide projections 404 are provided on the side of block 401 for guiding the resilient tongue 308 when the card is introduced into the pocket. The length of recess 309 is such that it receives catch 403 with play, abutment engagement of the card being obtained by means of a screw 151 on the terminal strip 150 as will be described hereafter.

The molded metal head base 110 is arranged so as to house the supply for the multicard device and, when this device is a controller, for housing the central unit of this latter; it has a flat wall 111, two lateral sides 112, 113 and a bottom 114. The flat wall 111 has fixing orifices 115 which are used when the cell-like structure is fitted to a lateral support. Each lateral side 112, 113 comprises two flanges 116 adapted for securing the fixing lugs 207 of the shield of the adjoining pocket. The bottom has means 116a for engagement and/or fixing by screwing or snap fitting to a support; the edge of this bottom is provided with centering elements 117 on the side of the pocket to be fixed.

Figure 10:
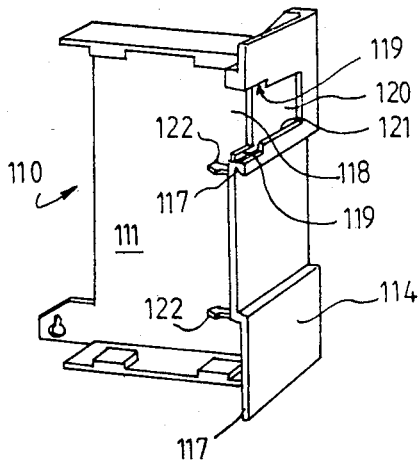
FIG. 10 shows, in a rear perspective view, a variant, of the head base.
Figure 11:
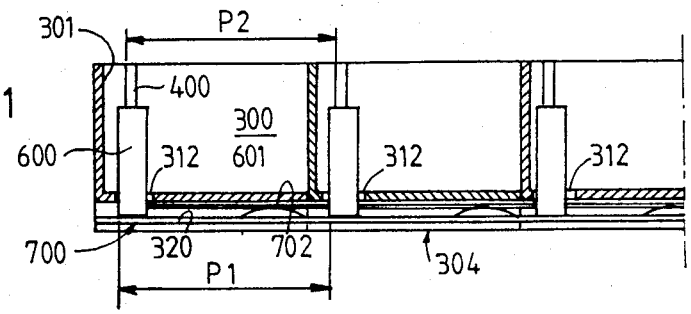
FIG. 11 is a partial sectional view of a cell-like structure at right angles to the connection windows.

In the embodiment shown in FIG. 10, the metal head base is meant to receive, besides a regulated power supply, a central controller unit; for providing connection of a card not shown, it has a window 118 for passing a connector 600 therethrough, bearing faces 119 for the corresponding faces of the connector and an indented housing 120 defining notches 121 for means for securing the connector; element 119, 121 of the base have similar functions to those 318, 320 of the rear faces of the pockets.

Catches 122 are disposed for cooperating with the openings 203 in the shield 200 completing this basic pocket.

Figure 8:
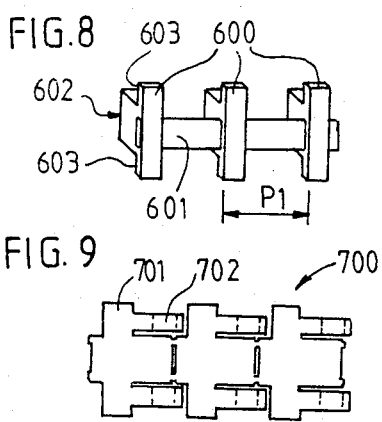
FIGS. 8 and 9 show a rear connection assembly and a plate for securing this assembly.
Figure 9:
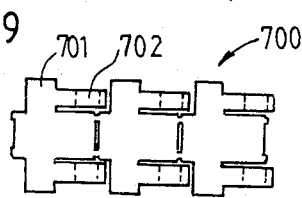

The connection assembly shown in FIGS. 8 and 9 connects the connectors 600 to the same flat cable or harness multiconductor bus 601. The minimum pitch P1 between connectors being greater than the maximum pitch P2 of the pockets. Each connector has a T shape and comprises a front connecting face 602 and, on the wings of the T, front bearing faces 603 adapted for cooperating with the faces 119 of the base. A fixing and shield member 700 (FIG. 9) associated with the connection assembly comprises a sheet metal plate cut out and shaped so as to have lateral projections 701 and pressure fingers 702, this plate serving to lock the connectors after they are plugged into the cards.

The device described is assembled in the following way. The card guide cell 300 of each pocket is molded and bent as already described, then fitted into a shield 200, the catches 311 of the cell not being yet engaged in the openings 203 in the shield, the lugs 207 of the shield project from the cell. The base pocket is then assembled to base 110 by engaging centering pins 322 in the corresponding holes 117 in the base, then by pushing the shield so as to cause it to move rearwardly in translation until lugs 207 snap fit in the flanges 116 and the shield comes into abutment against the bottom 304 of the card guide cell; it should be noted that during the translational movement of the shield, catches 311 are engaged in openings 203 so as to prevent henceforth any relative movement of the cell with respect to the shield.

The second pocket is assembled in the same way to the first and the third to the second. The modular structure is therefore outwardly strong and rigid because of the snap fitting of the shields, which ensures their electrical connection while providing inwardly flexibility for introducing and connecting the electronic cards. It follows from the mode of assembly described that the number of pockets forming the same assembly is not limited. The corresponding electronic card 400 is introduced into each cell 130 by sliding the card in slides 303; when fully introduced, the end of tongue 308 of the card guide cell is engaged in the guide projections 404 of block 401 integral with the card and catch 403 penetrates into the V shaped recess 309 in the tongue, the length of the recess leaving a certain freedom of translational movement for the card.

The terminal strip 150 is then positioned on the pocket 130 and its fixing screw 151 is screwed into the anchor nut 402 in block 401; the terminal strip bears against the front face of the cell 130 and screwing of screw 151 then results in drawing card 400 forwards until catch 403 abuts against the sides of the V of recess 309, which centers and secures the card with respect to its reception cell.

The connection assembly comprising the flat cable and the three connectors 600 is then brought close to the rear face of the modular structure and the connectors are introduced through the windows 312 in the pockets and possibly through window 118 in the base (in the embodiment shown in FIG. 10) and are plugged into the insert zones or rear connectors of cards 400, until the faces 603 of the connectors come to bear against the faces 318, 119 of the pockets or the base.

Plate 700 is positioned on the back of the connectors and its projections 701 are engaged in the housing with indentations 319, 120, with the pressure fingers 702 bearing against the rear face 603 of each connector 600. Thus, the shield plate secures each connector 600 in its self centering position with respect to the previously secured card and so to the corresponding card guide cell.

It follows from the above description that the card guide cell 300, made rigid by the addition of the corresponding shielding 200, plays the role of positional reference both for card 400 via slides 303 and the snap fit recess 309 for the terminal strip 150 via screw 151, the anchor nut 402 and the snap fitting 309, 403 for the rear terminal strip via card 400 and the bearing faces 318. Self centering of the rear connectors on the cards already secured in position eliminates the usual requirements of aligning the connectors with respect to the empty card guides.

The exchange of a defective card 400 is achieved by unscrewing screw 151 from the terminal strip 150, unplugging the terminal strip which remains connected to the pocket by a holding cord, unlocking the card by moving aside tongue 308 and then removing the card preferably by taking hold of block 401. The replacement card is slid into slides 303, is connected at the end of travel to rear connector 600, is fixed as before by snap fittings 309, 403 and is locked after the terminal strip 150 has been put back into place by screwing screw 151.

What is claimed is:

1. A modular cell for supporting and protecting electronic cards comprising a flat element or blank having two parallel side edge portions, a front edge portion and a rear edge portion; a bottom extending perpendicularly to said blank from said rear edge portion and two lateral sides extending perpendicularly to said blank respectively from said two side edge portions, said lateral sides having card guide means forming two respective lateral slides parallel to the blank and at a small distance therefrom, the spacing of these two slides being provided so that the cards may be engaged therein by two of their opposite lateral edge portions and may slide therein, further comprising fixing means for holding said card in position with respect to said blank, once the card has reached its position of use inside the cell at the end of its sliding travel in said slides, said fixing means comprising snap fit means provided on the blank cooperating with corresponding snap fit means provided on or added to the card.

2. The cell as claimed in claim 1, wherein said snap fit means are adapted so as to provide self centering and positional fixing of the card on said blank.

3. The cell as claimed in claim 1,
    wherein said snap fit means are formed by a catch provided on a fixing block added to the card and a recess of corresponding shape provided in the blank of the cell.

4. The cell as claimed in claim 4, wherein said fixing block comprises a threaded portion provided for cooperating with a screw fixing a terminal strip associated with the cell, the threaded portion being positioned with respect to the card so that tightening of the screw causes rear abutment engagement of the terminal strip against the cell and front abutment engagement of the card against the cell.

5. The cell as claimed in claim 1, wherein:

(i) said bottom comprises at least one window for passing therethrough a rear connector pluggable into the rear connections of the card;

(ii) the rear face of said bottom has bearing surfaces for a corresponding connector and means for securing said connector which are adapted so as to secure the connector in its first plug in position;

(iii) said window has a width and a height greater that those of the connector.

6. The cell as claimed in claim 5, wherein said means for securing said connector are formed by a resilient pressure plate engageable in an indented housing in the rear face of the cell.

7. The cell as claimed in claim 6,
wherein said lateral sides are held in position perpendicularly to the blank by means of a snap fit device provided between the bottom and the lateral edge portions of the lateral sides adjacent said bottom.

8. The cell as claimed in claim 1, wherein said bottom comprises means for direct fixing of the cell on a support.

9. The cell as claimed in claim 1,
wherein said lateral sides are joined to lateral edge portions of the blank by means of hinge connections.

10. The cell as claimed in claim 9 made from a molded plastic material and wherein said hinge means consists of flexible integrally molded connecting lugs or from lines of lesser thickness.

11. The cell as claimed in claim 1,
further comprising a shield formed by a piece of sheet metal having a flat face covering said blank and two lateral wings bent at right angles and coming back over said lateral sides, said shield further comprising means for assembly by sliding said cell.

12. The cell as claimed in claim 11, wherein said shield comprises complementary shapes, such as hooks and slits for assembling several cells together by juxtaposition and translation, so as to obtain a cell-like structure having multiple cells whose shields are connected electrically together.

13. The cell as claimed in 11,
wherein the flat face of the shield comprises cut outs in which catches provided on the outer face of said blank are snap fitted at the end of assembly.

14. The cell as claimed in claim 1, wherein said bottom comprises means for direct fixing of the cell on complementary means for assembly between cells.

15. The cell as claimed in claim 1, wherein said bottom comprises means for fixing of the cell on complementary means for assembly between a cell and a base.

* * * * *